United States Patent
Sawada et al.

[11] Patent Number: 5,981,444
[45] Date of Patent: *Nov. 9, 1999

[54] PROCESS FOR MANUFACTURING A SUPERCONDUCTING WIRE OF COMPOUND OXIDE-TYPE CERAMICS

[75] Inventors: Kazuo Sawada; Kazuhiko Hayasi; Sigeki Isojima, all of Osaka; Susumu Yamamoto, Hyogo; Teruyuki Murai, Hyogo; Nozomu Kawabe, Hyogo; Hideo Itozaki, Hyogo; Nobuhiko Fujita, Hyogo; Kenichiro Sibata, Hyogo; Nobuyuki Sasaki, Hyogo; Shuji Yazu, Hyogo; Tetsuji Jodai, Hyogo, all of Japan

[73] Assignee: Sumitomo Electric Industries, Ltd., Osaka, Japan

[ * ] Notice: Under 35 U.S.C. 154(b), the term of this patent shall be extended for 476 days.

[21] Appl. No.: 08/851,312

[22] Filed: May 5, 1997

Related U.S. Application Data

[63] Continuation of application No. 08/451,034, May 25, 1995, abandoned, which is a continuation of application No. 08/364,006, Dec. 27, 1994, abandoned, which is a continuation of application No. 07/979,449, Nov. 20, 1992, abandoned, which is a continuation of application No. 07/579,666, Sep. 7, 1990, abandoned, which is a division of application No. 07/152,713, Feb. 5, 1988, abandoned.

[30] Foreign Application Priority Data

| Feb. 5, 1987 | [JP] | Japan | 62-25224 |
| Mar. 20, 1987 | [JP] | Japan | 62-66992 |
| Mar. 31, 1987 | [JP] | Japan | 62-77941 |
| Apr. 13, 1987 | [JP] | Japan | 62-90426 |
| Apr. 16, 1987 | [JP] | Japan | 62-93973 |
| Apr. 16, 1987 | [JP] | Japan | 62-93974 |
| Apr. 18, 1987 | [JP] | Japan | 62-95882 |
| Apr. 24, 1987 | [JP] | Japan | 62-102901 |
| May 19, 1987 | [JP] | Japan | 62-121733 |
| May 19, 1987 | [JP] | Japan | 62-121734 |
| Aug. 24, 1987 | [JP] | Japan | 62-209842 |

[51] Int. Cl.$^6$ ................................................ H01L 39/24
[52] U.S. Cl. ........................... 505/433; 29/599; 505/500
[58] Field of Search .......................... 29/599; 505/430, 505/433, 500, 705

[56] References Cited

U.S. PATENT DOCUMENTS

3,325,888  6/1967  Weinig et al. ............................. 29/599

(List continued on next page.)

FOREIGN PATENT DOCUMENTS

3 817 693  5/1988  Germany .

(List continued on next page.)

OTHER PUBLICATIONS

"Metallurgy", Johnson & Weeks, $5^{th}$ Edition, 1977, p. 345.

(List continued on next page.)

*Primary Examiner*—Joseph M. Gorski
*Attorney, Agent, or Firm*—Foley & Lardner

[57] ABSTRACT

A process for manufacturing a superconducting elongated article such as a superconducting wire which is applicable for manufacturing a superconducting coil or the like. The process includes steps comprising filling a metal pipe with material powder of ceramic consisting of compound oxide having superconductivity, performing plastic deformation of the metal pipe filled with the ceramic metal powder to reduce the cross section of the metal pipe, and then subjecting the deformed metal pipe to heat-treatment to sinter the ceramic material powder filled in the metal pipe. The ceramic material powder may contain compound oxide having Perovskite-type crystal structure exhibiting superconductivity.

The metal pipe may selected from a group comprising metals of Ag, Au, Pt, Pd, Rh, Ir, Ru, Os, Cu, Al, Fe, Ni, Cr, Ti, Mo, W and Ta and alloys including these metals as the base. The heat-treatment may be carried out at a temperature ranging from 700 to 1,000° C., The plastic deformation of the metal pipe filled with the ceramic metal powder may be performed in such manner that the cross section of the metal pipe is reduced at a dimensional reduction ratio ranging from 16% to 92% by wire-drawing or forging by means of dies, roller dies, or extruder.

23 Claims, 6 Drawing Sheets

U.S. PATENT DOCUMENTS

| | | | |
|---|---|---|---|
| 4,952,554 | 8/1990 | Jin et al. ...................................... | 505/1 |
| 5,409,890 | 4/1995 | Yamamoto et al. ................... | 29/599 X |
| 5,424,282 | 6/1995 | Yamamoto et al. ..................... | 505/433 |

FOREIGN PATENT DOCUMENTS

| | | | |
|---|---|---|---|
| 2069295 | 6/1977 | Japan ........................................ | 29/599 |
| 52-2069295 | 6/1977 | Japan ........................................ | 29/599 |
| 54-9022592 | 8/1979 | Japan ........................................ | 29/599 |
| 9022592 | 8/1979 | Japan ........................................ | 29/599 |
| 60 160 511 | 8/1985 | Japan . | |

OTHER PUBLICATIONS

Yamada et al, "Critical Curren Density of Wire–Type Y–BA–CU Oxide Superconductor", Japanese Journal of Applied Physics, vol. 26, No. 5, pp. 865–866, May 1987.

Seeber et al, "Investigation of the Properties of $PbMo_6S_8$ Powder Processed Wires", IEEE Transactions of Magnetics, vol. 19, No. 3, pp. 402–405, May 1983.

Bednorz et al, "Possible High $T_c$ Superconductivity in the Ba–La–Cu–O System", Zeitschraft Für Physik B Condensed Matter, vol. 64, No. 2, pp. 189–193, 1986.

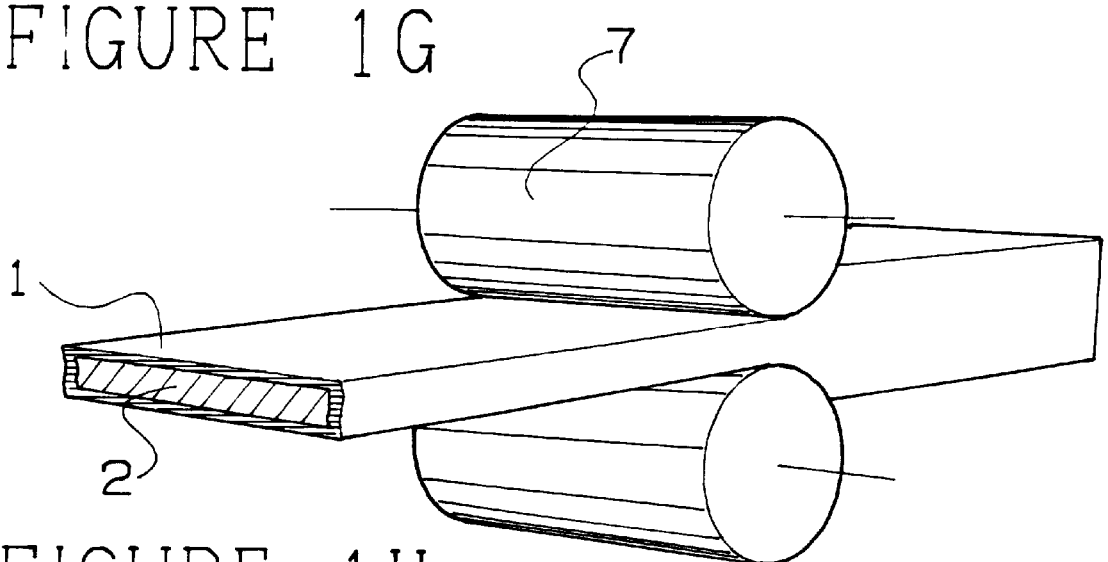
FIGURE 1G
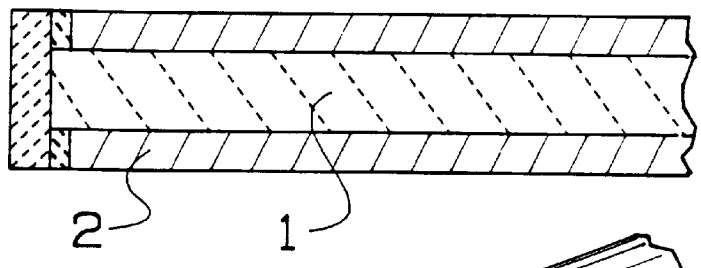
FIGURE 1H
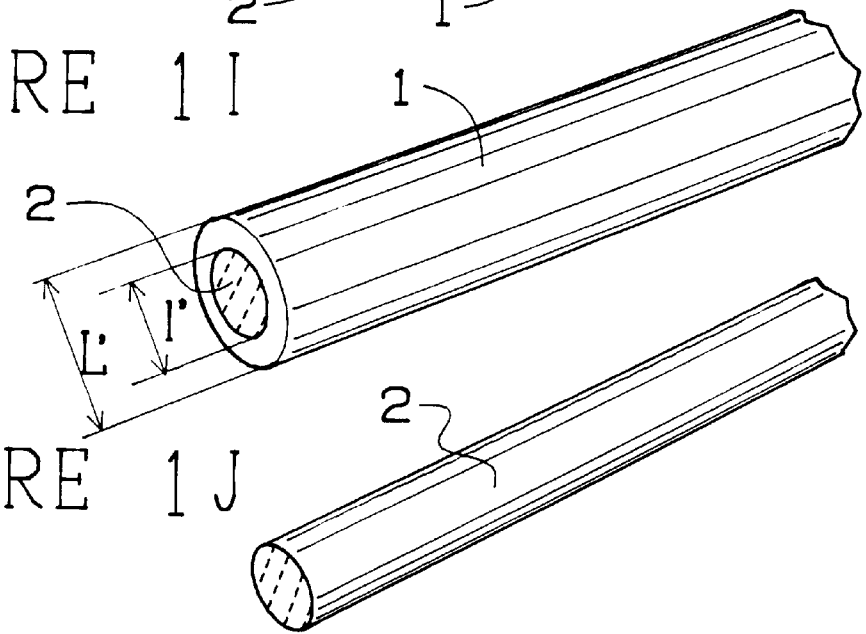
FIGURE 1I
FIGURE 1J

PROCESS FOR MANUFACTURING A SUPERCONDUCTING WIRE OF COMPOUND OXIDE-TYPE CERAMICS

This is a continuation application under 37 CFR 1.62 of prior application Ser. No. 08/451,034 filed on May 25, 1995 and now abandoned, which is a continuation of prior application Ser. No. 08/364,006, filed on Dec. 27, 1994, and now abandoned which is a continuation of Ser. No. 07/979,449, filed on Nov. 20, 1992, now abandoned, which is a continuation of Ser, No. 07/579,666, filed on Sep. 7, 1990, now abandoned, which is a divisional application of prior application Ser. No. 07/152,713, filed on Feb. 5, 1988, entitled PROCESS FOR MANUFACTURING A SUPERCONDUCTING WIRE OF COMPOUND OXIDE-TYPE CERAMICS, and now abandoned.

BACKGROUND OF THE INVENTION

1. Field of the invention

The present invention relates to a process for manufacturing an elongated article made of sintered ceramic having superconductivity.

Particularly, it relates to a process for manufacturing a superconducting wire made of sintered ceramic of compound oxide which is applicable for producing a superconducting coils or the like.

More particularly, the present invention relates to a process for manufacturing a superconducting wire made of sintered ceramic of compound oxide having higher critical current density and higher critical transition temperature of superconductivity.

2. Description of the related art

The superconductivity is a phenomenon in which the electrical resistance become zero and hence can be utilized to realize power cables and a variety of devices and apparatus which are requested to reduce consumption of electrical energy and several ideas of its applications which utilize the phenomenon of superconductivity have been proposed.

In fact, the superconductivity are applicable in a variety of industrial fields, for example in the field of electrical power supply such as fusion power, MHD power generation, power transmission, or electric power reservation; in the field of transportation such as magnetic levitation trains, magnetically propelling ships; in the medical field such as high-energy beam radiation unit; in the field of science such as NMR or high-energy physics; or in the field of sensors or detectors for sensing very weak magnetic field, microwave, radiant ray or the like as well as in the field of electronics such as Josephson Junction devices and high-speed computers with reduced energy consumption.

However, their actual usage have been restricted because the phenomenon of superconductivity can be observed only at very low cryogenic temperatures. Among known superconducting materials, a group of materials having so-called A-15 structure show rather higher Tc (critical temperature of superconductivity) than others, but even the top record of Tc in the case of $Nb_3Ge$ which showed the highest Tc could not exceed 23.2 K at most.

This means that liquidized helium (boiling point of 4.2 K) is only one cryogen that can realize such very low temperature of Tc. However, helium is not only a limited costly resource but also require a large-scaled system for liquefaction. Therefore, it had been desired to find another superconducting materials having much higher Tc. But no material which exceeded the abovementioned Tc had been found for all studies for the past ten years.

It is known that certain ceramics material of compound oxides exhibit the property of superconductivity. For example, U.S. Pat. No. 3,932,315 discloses Ba—Pb—Bi-type compound oxide which shows superconductivity. This type superconductor, however, possess a rather low transition temperature of lower than 13 K and hence usage of liquidized helium (boiling point of 4.2 K) as cryogen is indispensable to realize superconductivity.

Possibility of existence of a new type of superconducting materials having much higher Tc was revealed by Bednorz and Muller who discovered a new oxide type superconductor in 1986 (Z. Phys. B64 (1986) p189)

This new oxide type superconducting material is $[La, Ba]_2CuO_4$ or $[La, Sr]_2CuO_4$ which are so-called the $K_2NiF_4$-type oxide having such a crystal structure that is similar to Perovskite-type superconducting oxides which were known in the past (for example, $BaPb_{1-x}Bi_xO_3$ disclosed in U.S. Pat. No. 3,932,315). The $K_2NiF_4$-type oxides show such higher Tc as about 30 K which is extremely higher than that of known superconducting materials.

As the compound oxide type superconductors consisting of oxides of elements of IIa and IIIa groups in the Periodic Table, it can be mentioned those of, so to say, quasi-Perovskite structure which can be considered to have such a crystal structure that is similar to Perovskite-type oxides and includes an orthorhombically distorted perovskite or a distorted oxygen-deficient perovskite such as $Ba_2YCu_3O_{7-\delta}$ in addition to the abovementioned $K_2NiF_4$-type oxide such as $[La, Ba]_2CuO_4$ or $[La, Sr]_2CuO_4$. Since these superconducting materials show very high Tc of 30 to 90 K, it becomes possible to use liquidized hydrogen (b.p.=20.4 K) or liquidized neon (b.p.=27.3 K) as a cryogen for realizing the superconductivity in practice. Particularly, hydrogen is an inexhaustable resource except for danger of explosion.

However, the above mentioned new type superconducting materials which was just born have been studied and developed only in a form of sintered bodies as a bulk produced from powders but have not been tried to be shaped into a wire form. The reason is that the new type superconductors are ceramic materials of compound oxide which possess no superior plasticity or processablility in comparison with well-known metal type superconducting materials such as Ni—Ti alloy, and therefore they can not or are difficult to be shaped or deformed into an elongated article such as a wire by conventional technique such as wire-drawing technique in which superconducting metal is drawn directly or in embedded condition in copper to a wire form.

It is proposed in Japanese patent laid-open No. 61-131, 307 a method for manufacturing a superconducting wire from a metal type superconducting material which is apt to be oxidized and very fragile such as $PbMo_{0.35}S_8$, comprising charging the material powder in a metal shell, extruding the metal shell filled with the material powder at higher than 1,000° C., and then drawing the extruded composite. This metal working technique, however, can not apply directly to ceramic material consisting of compound oxide, because the compound oxide type superconducting materials can not exhibit the superconductivity if not the specified or predetermined crystal structure is realized. In other words, a superconducting wire having higher critical temperature and higher critical current density and which is useable in actual applications can not be obtained outside predetermined optimum conditions. In particular, if not the shell is selected from proper materials, the resulting compound oxide will be reduced due to chemical reaction with the metal of the shell, resulting in poor or inferior properties of superconductivity.

In the field of ceramic molding, it has been the general practice for manufacturing an elongated article such as wires or rods to add an organic binder to the material powder of ceramic in order to facilitate shaping or molding of the powder material. Thus, a mixture of the powder material and the organic binder is shaped into a rod by means of an extruder or a press machine and then the shaped rod is passed directly or through a trimming or cutting stage to an intermediate sintering stage to remove the organic binder before it is fed to the final sintering stage.

The combination of the abovementioned press-molding and trimming or cutting operations loose much material of expensive ceramics, so that not only economy of material is low but also a dimensional ratio of longitudinal direction to cross sectional direction of the rod can not be increased. Therefore, this process can not be used in practice.

The extrusion technique is much better than the press-molding technique in the economy of material and productivity, but requires great quantities of organic binder added to the powder material. This organic binder is difficult to be removed completely during the intermediate sintering stage and hence remain in the finally sintered article, resulting in a cause of defects of the product which will lower the strength and the resistance to flexion. Therefore, it is difficult to manufacture a fine rod of ceramics having higher dimensional ratios of longitudinal direction to cross sectional direction according to the extrusion technique.

In order to realize a reliable and practical superconducting structure, it is indispensable that the structure possesses enough strength and tenacity which is sufficient to endure bending force during usage and also has a finer cross sectional dimension as possible in such manner that it can transmit currency at higher critical current density and at higher critical temperature.

Therefore, an object of the present invention is to provide a process for manufacturing a superconducting wire of sintered ceramic having an enough length to be used in practical applications, namely having a higher dimensional ratio of longitudinal direction to cross sectional direction, without using organic binder which is causative of lowering the strength and tenacity of the product.

Another object of the present invention is to provide a process for manufacturing a fine superconducting wire of compound oxide type sintered ceramic having higher resistance to breakage, even if the the diameter of the wire is reduced greatly, in other words, under higher dimensional reduction ratio in cross section.

Still another object of the present invention is to provide a process for manufacturing a fine superconducting wire of compound oxide type sintered ceramic having higher critical current density and higher critical temperature.

SUMMARY OF THE INVENTION

A subject of the present invention resides in a process for manufacturing a superconducting elongated article including steps comprising filling a metal pipe with material powder of ceramic consisting of compound oxide having superconductivity, performing plastic deformation of the metal pipe filled with the ceramic metal powder to reduce the cross section of the metal pipe, and then subjecting the deformed metal pipe to heat-treatment to sinter the ceramic material powder filled in the metal pipe.

The elongated articles which can be manufactured by the process according to the present invention include rod, wire, strand, tape, band, or any other articles whose dimensional ratio of the elongated direction to the cross sectional direction is more than 30, the cross section of the article being not limited to a circle but may any configuration such as a rectangular.

The material powder of ceramic consisting of compound oxide having superconductivity include any compound oxide which exhibit superconductivity after the heat-treatment of the present invention.

Generally speaking, the material ceramic powder which can be used in the process of the present invention may have the general formula: AaBbCc, in which "A" stands for at least one element selected from a group comprising IIa and IIIa of the Periodic Table, "B" stands for at least one element selected from a group comprising Ia, IIa and IIIa of the Periodic Table, "C" stands for at least one element selected from a group comprising oxygen, carbon, nitrogen, fluorine and sulfur, and small letters "a" "b" and "c" stand for atom ratios of the elements "A", "B" and "C" and they preferably satisfy following equation:

"a"x(an average valence of "A")+"b"x(an average valence of "B")="c"x(an average valence of "C").

As the element of Ia group in the Periodic Table, it can be mentioned H, Li, Na, K, Rb, Cs and Fr. The elements of IIa in the Periodic Table may be Be, Mg, Ca, Sr, Ba and Ra. The elements of IIIa in the Periodic Table may be Sc, Y, La, Ce, Pr, Nd, Pm, Sm, Eu, Gd, Tb, Dy, Ho, Er, Tm, Yb, Lu, Ac, Th, Pa, Pa, U, Np, Pu, Am, Cm, Bk, Cf, Es, Fm, Md, Mo and Lr. The elements of Ia in the Periodic Table may be Cu, Ag and Au. The elements of IIb in the Periodic Table may be Zn, Cd and Hg. The elements of IIIb in the Periodic Table may be B, Al, Ga, In and Tl.

The material ceramic powder is preferably a powder mixture containing oxides of such metals that possess higher oxygen potential for producing the oxide than that of copper.

Among superconducting ceramics, it can be mentioned those that contain at least two elements selected from Ia, IIa and IIIa groups of the Periodic Table as "A", at least copper as "B", and oxygen as "C", for example, Y—Ba—Cu—O type ceramics, Y—Sr—Cu—O type ceramics, La—Sr—Cu—O type ceramics and La—Ba—Cu—O type ceramics.

The ceramic material powder may be compound oxides having the crystal structure of $K_2NiF_4$-type oxides, such as $[La, Ba]_2CuO_4$ or $[La, Sr]_2CuO_4$.

And also, the material ceramic powder may be compound oxides having Perovskite-type crystal structure exhibiting superconductivity having the general formula:

$$(\alpha_{1-x}, \beta_x)\gamma_y O_z$$

wherein $\alpha$ stands for an element selected from IIa group elements of the Periodic Table, $\beta$ stands for an element selected from IIIa elements of the Periodic Table, $\gamma$ stands for an element selected from a group comprising Ib, IIb, IIIb, IVa and VIIIa elements of the Periodic Table, x, y and z are numbers which satisfy following respective ranges:

$0.1 \leq x \leq 0.9$, $0.4 \leq y \leq 4.0$, and $1 \leq z \leq 5$.

In particular, a compound oxide in which $\alpha$ is Ba, $\beta$ is Y and $\gamma$ is Cu.

It is also preferable to use a ceramic material powder which is prepared by steps comprising mixing powders of $Bi_2O_3$, $SrCO_3$, $CaCO_3$ and CuO, drying and then compacting the powder mixture, sintering the compacted mass, and then pulverizing the sintered mass.

The material powders of ceramics are preferably granulated previously before they are filled into the metal pipe.

The metal pipe may be selected from a group comprising metals of Ag, Au, Pt, Pd, Rh, Ir, Ru, Os, Cu, Al, Fe, Ni, Cr, Ti, Mo, W and Ta and alloys including these metals as the base.

The heat-treatment may be carried out at a temperature range of from 700 to 1,000° C.

The plastic deformation of the metal pipe filled with the ceramic metal powder may be performed in such manner that the cross section of the metal pipe is reduced at a dimensional reduction ratio ranging from 16% to 92%. The operation of the plastic deformation may be carried out by wire-drawing which is perforemed by means of dies, roller dies, or extruder.

The plastic deformation may be performed by forging, for example by means of swaging unit or rolls.

It is also preferable to cool the metal pipe containing the sintered ceramic material powder therein slowly at a rate of less than 50° C./min, after the heat-treatment complete.

Now, an apparatus which can be used to realize the abovementioned process according to the present invention will be described with reference to attached drawings which are not limitative of the present invention.

BRIEF DESCRIPTION OF THE DRAWINGS

FIGS. 1A to 1J illustrate a series of steps for manufacturing a superconducting elongated article according to the present invention.

FIGS. 2A to 2C shows variations of the superconducting elongated articles according to the present invention, wherein FIG. 2A is an illustrative perspective view of the article, FIG. 2B is a cross section thereof, and FIG. 2C shows an illustrative view of another embodiment of the article.

FIG. 4 shows anther embodiment of the present invention, wherein,

FIG. 5 shows still another embodiment of the present invention, wherein,

Referring to FIG. 1, the FIG. 1A to FIG. 1J illustrate manufacturing steps for an elongated article according to the present invention.

Figure 1A:
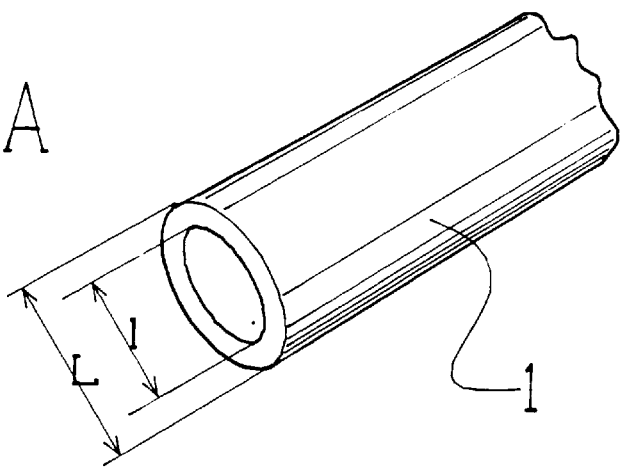
Figure 1B:
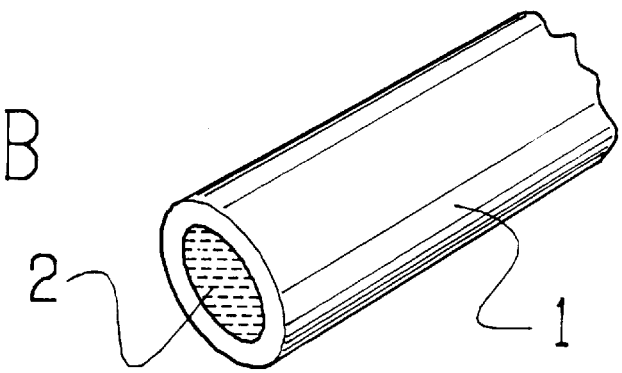

At first, a metal pipe 1 having a predetermined cross sectional configuration (outer diameter of "L", and inner diameter of "1") is filled with a material ceramic powder 2, as is shown in FIG. 1B.

Figure 1C:
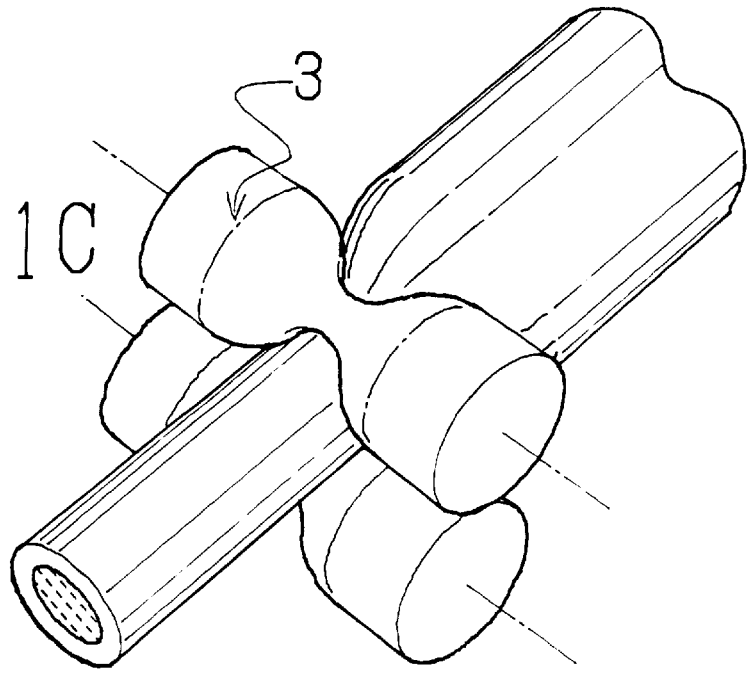
Figure 1D:
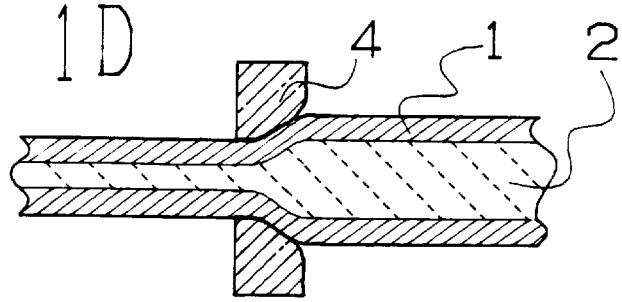
Figure 1E:
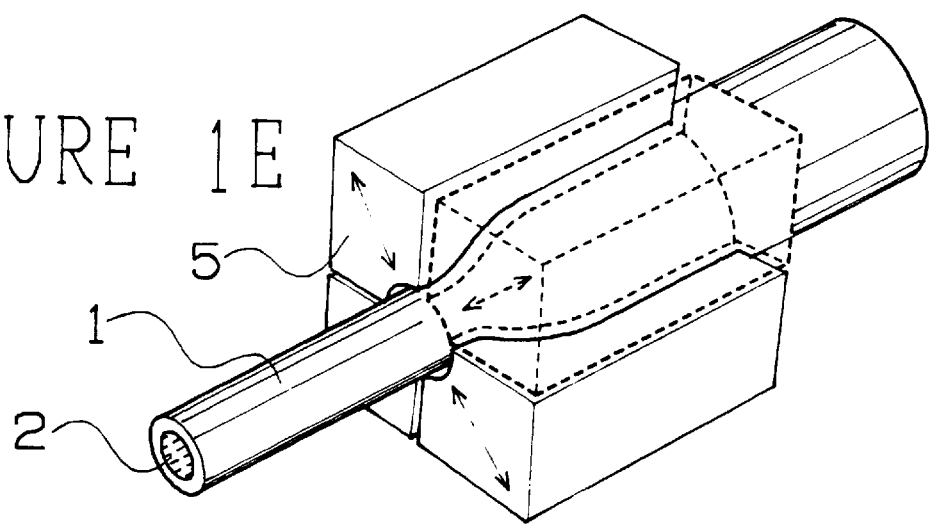
Figure 1F:
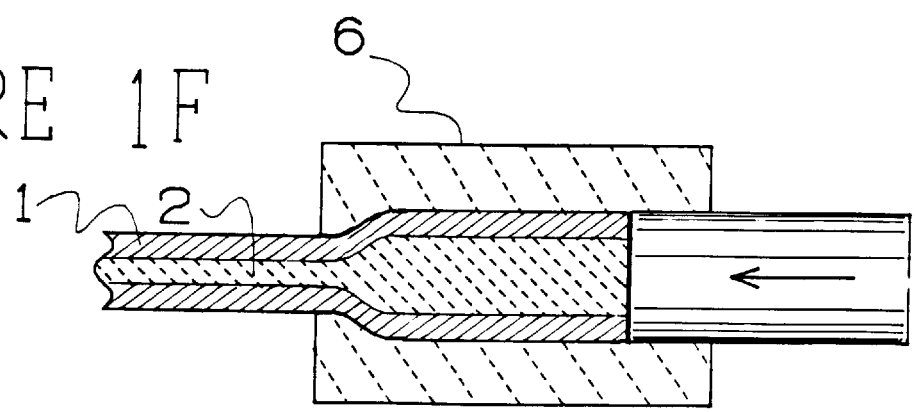

Then, the resulting metal pipe filled with the material ceramic powder is passed to an operation of wire-drawing which can be performed by means of roller dies 3 as is shown in FIG. 1C, or a die or a series of dies 4 shown in FIG. 1D in a cross section. The wire-drawing may be performed by means of a swaging unit 5 as is shown in FIG. E or an extruder-type wire drawing machine (FIG. 1F shows a cross section of an extruder head). In case of an elongated article having a rectangular cross section, the metal pipe may be rolled by means of rolls 7 as is shown in FIG. 1H.

An annealing step can be incorporated in the wire-drawing stage in order to facilitate operation of the wire-drawing. It is also preferable to seal one end or opposite ends of the metal pipe before entering into the wire-drawing operation as is shown in FIG. 1H to prevent the powder material from escaping out of the metal pipe.

FIG. 1I illustrates a perspective view of the resulting wire-drawn product comprising an inner core obtained from the material powder 2 having a reduced diameter "1'", so that the final product which will be obtained after following sintering step hereinafter described has the same configuration as FIG. 1I.

FIG. 1J illustrates a case in which the outer pipe is removed.

Figure 2A:
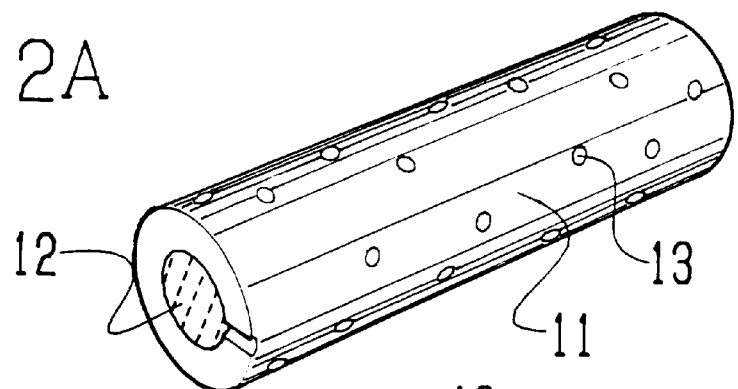
Figure 2B:
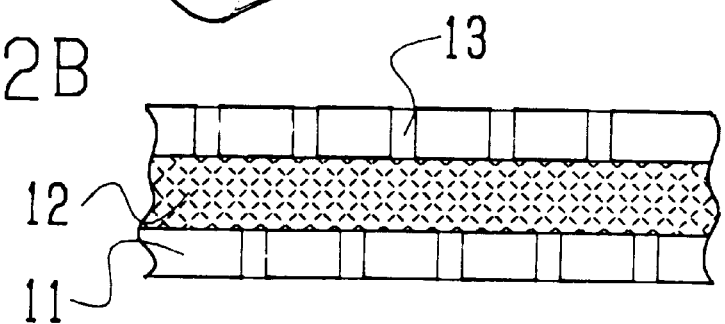
Figure 2C:
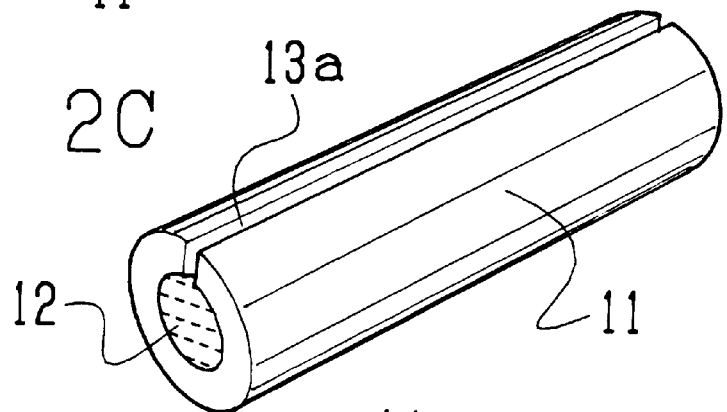

FIG. 2 shows a variation of the elongated article obtained according to the present invention, in which perforations or through holes are made in the metal pipe 11. In an embodiment shown in the perspective view of FIG. 2A, fine holes 13 are cut through the metal pipe over the whole surface thereof by means of $CO_2$ laser or the like. FIG. 2B is a cross sectional view of the pipe shown in FIG. 2A. The holes 13 may be replaced by a slit 13a shown in FIG. 2C. The slit 13a may have a dimension of about 200 $\mu$m in width.

Figure 3A:
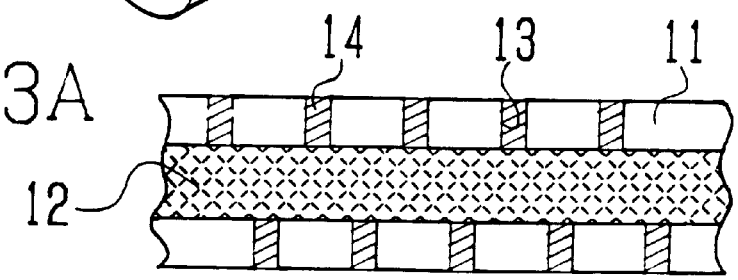
FIGS. 3A and 3B show cross sections of variations of FIG. 2.
Figure 3B:
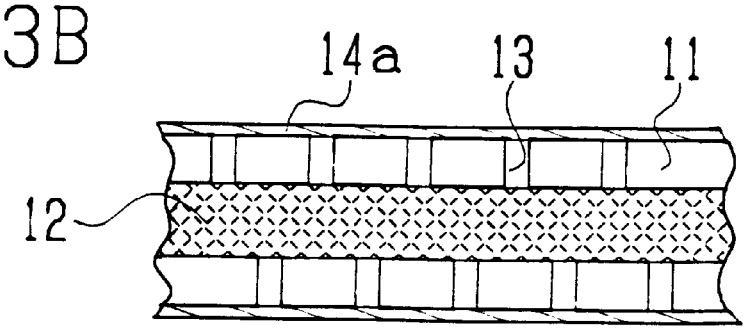

It is known that the resulting superconducting wire deteriorates under an oxygen containing atmosphere such as air, so that it is preferable to close up the holes 13 cut in the metal pipe 11. For this purpose, the holes 13 can be filled up with sealant 14 to isolate the sintered wire of superconductor 12 from ambient atmosphere as is shown in FIG. 3A. This method, however, is difficult to practice or has not higher productivity, so that, in practice, it is preferable to cover whole of the outer surface of the perforated metal pipe with a suitable air-tight cylindrical liner, for example a heat shrinkable plastic tube which is chemically stable as is shown in FIG. 3B. The liner may be composed of a metal layer vacuum-deposited on the whole surface of the metal pipe and more preferably may be made of low-melting point glass coated on the metal pipe to produce a complete sealing.

Figure 4A:
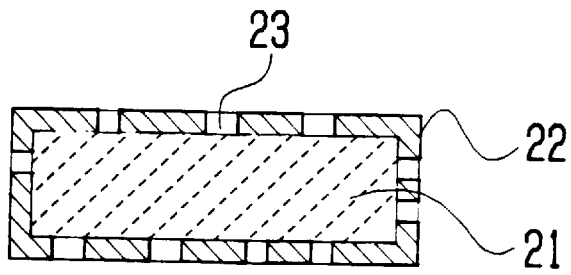
FIG. 4A is a cross section and FIG. 4B is a plane view of the elongated article according to the present invention.
Figure 4B:
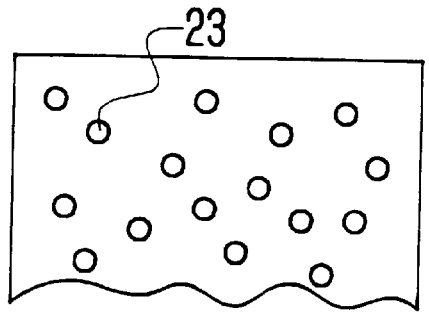

FIG. 4A illustrates an elongated sintered superconductor having a rectangular cross section according to an embodiment of the present invention and FIG. 4B shows a plane view thereof. This superconductor can be manufactured by a process including steps of molding of the superconducting material into a shape of rectangular body 21 and then covering the molded article 21 with a metal sheath 22.

Figure 5A:
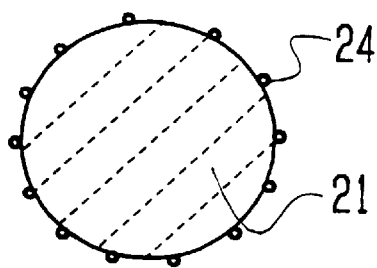
FIG. 5A is a cross section and FIG. 5B is a perspective view of the elongated article according to the present invention.
Figure 5B:
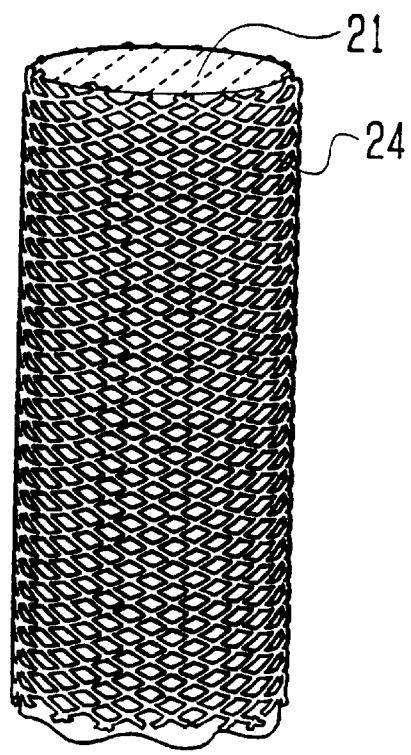

FIG. 5 illustrates another embodiment of the elongated article having a same circular cross section as that of FIG. 1I according to the present invention, but, in this case, a superconductor 21 is covered with a sheath 24 made of a net. FIG. 5A is a cross sectional view and FIG. 5B is a perspective view of the the resulting superconductor.

The abovementioned variation can be adopted to a variety of applications. The presence of the abovementioned porous outer sheath or shell have following advantages:

At first, the surface of the sheath 22 and 24 is oxidized by the oxidative treatment to produce copper oxide, so that the contents of oxygen in the sintered superconductor is not influenced or fluctuated by the oxidation of the sheath 22 or 24. In particular, in case of FIG. 2A and FIG. 4, through holes 13 are dispersed on the whole surface of the metal pipe 11 and 22 and, so that the sintered superconductor can communicate with an outer atmosphere. Higher contact surface between the superconductor and the surrounding atmosphere can be assured by the net-like sheath 24.

Figure 6:
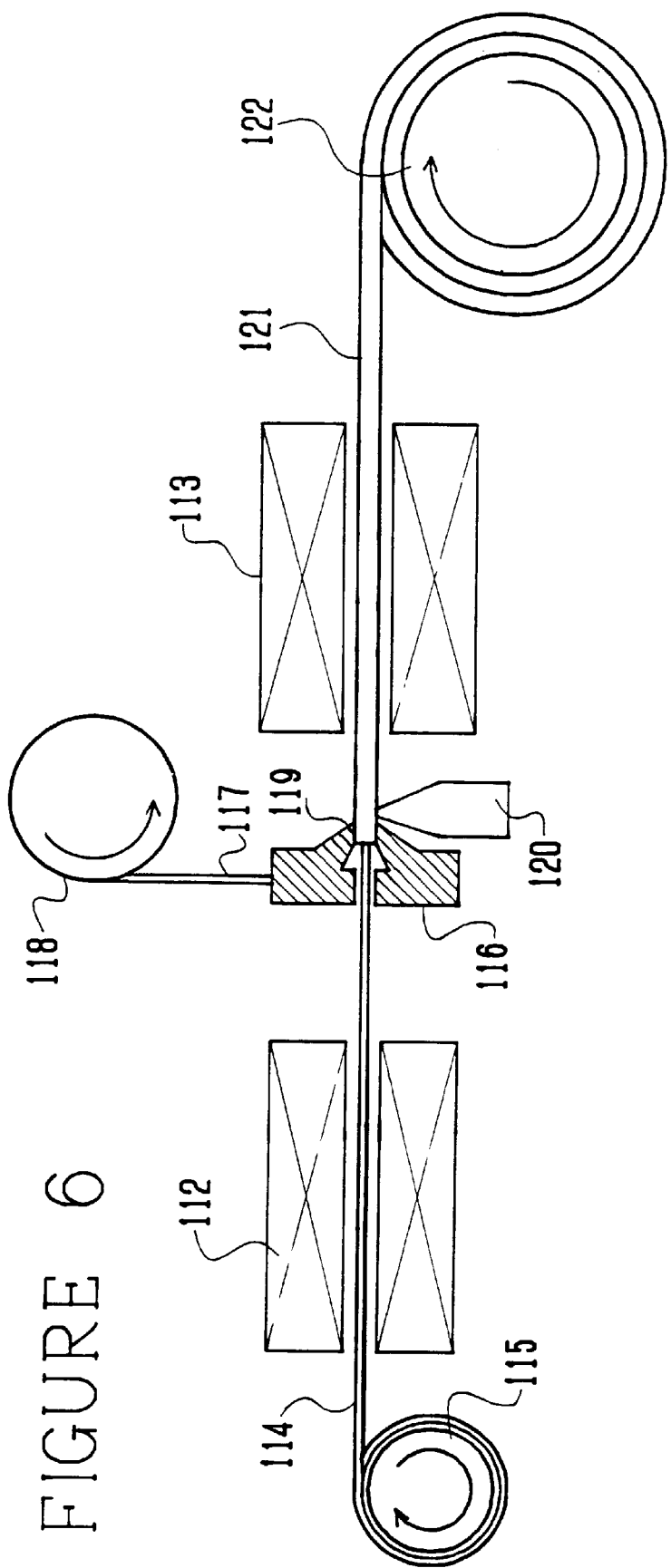
FIG. 6 is an illustrative view of an apparatus for manufacturing continuously a composite having a tape-like configuration according to the present invention.

FIG. 6 illustrates an apparatus for producing an elongated article continuously according to the present invention. In this case, the material ceramic powder is preferably blended with organic binder.

The apparatus includes a continuous furnace being provided with two heating means of a binder-removing zone 112 and a sintering zone 113. An elongated shaped tape or wire 114 is supplied to an inlet of the binder-removing zone 112 from a coiler 115. The elongated article 114 unwound from the coiler 115 is fed continuously to the to the binder-removing zone 112 in which the elongated article 114 is heated at a temperature of 400 to 700° C. to remove the binder out of the elongated article 114.

After the binder-removing zone 112, the elongated article 114 is passed to a continuous lining station 116 which is positioned at the downstream of the binder-removing zone 112. The continuous lining station 116 is provided with a drum 118 for feeding a sheet 117 of metal or alloy to a guide 119 where the sheet 117 is wound around the elongated article 117. A seam of the wound sheet 117 is welded by means of a laser welder 120 so that the elongated article 114 is wrapped by the metal sheet 117.

The resulting composite comprising the elongated article 114 and the covering sheet or outer sheath 117 is then passed to the sintering zone 113 where the composite is heated at a temperature of 850 to 950° C. to sinter the elongated article. The longitudinal dimension or length of the sintering zone 113 and the advancing velocity of the composite can be adjusted in such manner that the sintering is performed completely.

The product 121 thus obtained may be wound about a drum 122 for stock. In this embodiment, the product possesses enough flexibility and self-supporting properties, since the elongated article 114 contains the binder. The apparatus shown in FIG. 6 permit to carry out the sintering operation continuously at a higher productivity.

According to a variation of the present invention, the composite comprising the elongated article and the outer sheet can be shaped or deformed into a desired configuration such as a coil or the like due to the higher flexibility and self-supporting property, so that the sintering can be performed in the condition of the coiled configuration or in a condition that the coiled is supported on any other conductive body. The existence of the sheath of metal or alloy also increase the deflective strength.

DESCRIPTION OF THE PREFERRED EMBODIMENTS

In a preferable embodiment according to the present invention, as the material ceramic powder, following powders may be mentioned:

(1) Ceramic powder containing compound oxides having the crystal structure of $K_2NiF_4$-type oxides having superconducting property, particularly powders of

[La, Ba]$_2$CuO$_4$ or [La, Sr]$_2$CuO$_4$.

(2) Compound oxides having Perovskite-type crystal structure exhibiting superconductivity having the general formula:

$(\alpha_{1-x}\beta_x)\gamma_yO_z$ wherein $\alpha$ stands for an element selected from IIa group elements of the Periodic Table, $\beta$ stands for an element selected from IIIa elements of the Periodic Table, $\gamma$ stands for an element selected from a group comprising Ib, IIb, IIIb, IVa and VIIIa elements of the Periodic Table, x, y and z are numbers which satisfy following respective ranges:

$0.1 \leq x \leq 0.9$, $0.4 \leq y \leq 4.0$, and $1 \leq z \leq 5$.

In particular, a Ba—Y—Cu—O-type compound oxide in which $\alpha$ is Ba, $\beta$ is Y and $\gamma$ is Cu.

It is possible to use another type ceramic material powders for example a compound oxide composed of at least two elements selected from a group comprising IIa and IIIa groups in the Periodic Table, one element selected from a group comprising Va group in the Periodic Table, Cu and oxygen, such as Sr—Ca—Bi—Cu—O type compound oxide which is prepared for example by the steps comprising mixing powders of $Bi_2O_3$, $SrCO_3$, $CaCO_3$ and CuO, drying and then compacting the powder mixture, sintering the compacted mass, and then pulverizing the sintered mass.

The material powders used in the present invention are not limited to those abovementioned.

The material powders of ceramics are preferably granulated previously before they are filled into the metal pipe. When the material powder can not compacted into the metal pipe at a higher packaging density, it is desirable to granulate the material powder previously to facilitate charging operation into the metal pipe and to obtain a higher packaging density.

According to a preferred embodiment, the material powder is granulated into particles having an average particle size of less than 0.1 mm and then is heat-treated before they are charged into the metal pipe. This heat-treatment correspond to the final sintering used in the conventional procedure. In this case, if necessary, the material powder may be further heat-treated again after the powder is compacted in the metal pipe. If the heat-treatment of the powder material result in coagulation of powders to produce large particles having an average particle size of more than 0.1 mm, the heat-treated powder may be pulverized before it is compacted in the metal pipe. In this case, conventional final heat-treatment is carried out in the condition of powder having an average particle size of less than 0.1 mm. Therefore, the resulting heat-treated powder as a whole possess the crystal structure which exhibits superconductivity and hence there remain no portion where superconductivity is not exhibited. Still more, higher packing factor or density is obtained in the metal pipe and also higher ratio of elongation of the wire is assured. In conclusion, the resulting wire obtained according to this embodiment is changed to an elongated superconducting wire having higher critical current density.

In operation, a wire of compound oxide having the crystal structure of $K_2NiF_4$-type oxides such as a powder of [La, Ba]$_2$CuO$_4$ or [La, Sr]$_2$CuO$_4$ which can be obtained by sintering a material powder mixture of oxides, carbonates, nitrate, sulfates or the like of the constituent elements of the compound oxide, for example, a powder mixture of $La_2O_3$, $BaO_2$, $SrO_2$, and CuO.

The metal pipe may be made of a metal selected from a group comprising Ag, Au, Pt, Pd, Rh, Ir, Ru, Os, Cu, Al, Fe, Ni, Cr, Ti, Mo, W and Ta and of an alloy including these metals as the base.

On particular, it is preferable to select among Ag, Au, platinum metals comprising Pt, Pd, Rh, Ir, Ru and Os and alloys containing them as the base metal. The metals of Ag, Au and platinum metals are almost inactive to the superconducting ceramic materials under heated condition, and hence the heat-treatment operation can be carried out at a sufficiently high temperature so as to accelerate the sintering or solid-solid reaction among superconducting ceramic particles in the metal pipe to obtain a uniform elongated article. When the metal pipe made of copper is used in place of the platinum metals, there is a possibility of reaction between the superconducting material and the copper of the metal pipe, which results in that the composition in the resulting wire will deviate or fluctuate. Still more, since the copper pipe is apt to be oxidized and hence it is difficult to perform the heat-treatment at a high temperature. These problem may be avoidable by using the pipe of platinum metals which is chemically inactive to the ceramics filled in the pipe and hence the resulting wire possesses a composition which is uniformly distributed along the longitudinal direction. Therefore, the superconducting wire whose outer metal pipe is made of platinum metal exhibits almost same critical temperature as a bulk or mass which is produced by sintering from same material ceramic powder and shows much higher critical current density in comparison with a wire whose outer metal pipe is made of copper.

According to the present invention, it is also possible to arrange another metal such as copper, copper alloy or stainless steel around the outer metal pipe. Such additional metal layer will increase the flexibility of the resulting wire which is obtained by plastic deformation.

The step of the plastic deformation of the metal pipe filled with the ceramic metal powder is preferably carried out under such condition that the cross section of the metal pipe is reduced at a dimensional reduction ratio ranging from 16% to 92%, more particularly from 20% to 90%. If the reduction ratio exceeds 92%, the material powder filled in the pipe will not follow or accompany with the movement of the inner surface of the metal pipe, resulting in breakage of the sintered ceramic wire inside the metal pipe at several points. To the contrary, if the reduction ratio is lower than 16%, satisfactory packaging density in the metal pipe can not be expected, so that complete sintering can not be performed.

The plastic deformation is preferably performed by the technique of wire-drawing, particularly, by means of a die or a series of dies, a roller die or a series of roller dies, or an extruder or a series of extruders. The plastic deformation may be carried out by forging which is preferably machine works of swaging or rolling.

It is also possible to combine more than two operations of the abovementioned plastic deformations of extrusion, rolling, swaging and other wire drawing. It is also possible to shape the deformed wire into a desired configuration such as a shape of a coil which is applicable to a superconducting magnet or the like before the coil is heat-treated.

The heat-treatment of the metal pipe filled with the material ceramic powder which is performed after the plastic deformation is preferably carried out at a temperature ranging from 700 to 1,000° C. which is selected in the function of the constituent elements of the ceramics. Thus, the superconducting powder filled in the metal pipe are remained in a condition that they are contacted with each other but are not fused to form a continuous body even after the plastic deformation. The heat-treatment promote sintering or reaction among powders to produce a product having the uniformity.

Generally speaking, the temperature at which the sintering of powders of compound oxide is performed is below a melting point of the sintered body which is the upper limit and is preferably above a temperature which is 100° C. lower than the melting point. If the sintering temperature is lower than the temperature which is 100° C. lower than the melting point, complete sintering reaction can not be achieved and hence the resulting product will not have practical strength. To the contrary, if the sintering temperatue exceeds the upper limit of melting point, liquid phase will be produced so that the sintered body melts or decomposed, resulting in lowering the Tc.

According to an embodiment, after the metal pipe filled with the material powder is deformed or wire-drawn to an objective configuration, the metal pipe is subjected to the sintering operation at a temperature where the superconductor of compound oxide is not produced but which is more than a half or ½ of the reaction temperature in absolute temperature to such extent that boundaries of the material powders diffuse each other. After the wire-drawing step, it is also preferable to perform an intermediate annealing which is followed by another wire-drawing. If necessary, a combination of the wire-drawing and the intermediate annealing can be repeated for desired times. After then, the sintered composite is subjected to the final treatment including a slow cooling at a rate of less than 50° C./min and a rapid cooling at a rate of more than 50° C. to obtain the final product of superconductor. The reasons why the abovementioned procedure is preferable come from such fact that the superconducting ceramic of Y—Ba—Cu—O type compound oxide do not exhibit the property of superconductivity if not it is sintered at a temperature of more than about 900° C. and hence one constituent element of Cu in the ceramic is reduced by the reaction with the metal which constitute the outer pipe, which result in deterioration of the superconductivity. To solve this problem, it is preferable to use, as the material powder, such a powder which is prepared by pulverizing a sintered ceramic mass which itself has superconductivity and to perform the sintering operation at a temperature where no reductive reaction occur after the wire-drawing operation.

It is also preferable that, after the sintering or heat-treatment complete, the metal pipe containing sintered ceramic body therein is cooled slowly at a rate of less than 50° C./min. When the process according to the present invention is applied for a sintered ceramic wire of Y—Ba—Cu—O type compound oxide or the like, improvement in the property of superconductivity can be ahieved by the heat-treatment including a slow cooling of the sintered body at a rate of less than 50° C./min and a rapid cooling thereof at a rate of more than 50° C.

The outer metal pipe or sheath can be removed after the sintering complete, but if necessary, the outer metal pipe may be remained as it is on the outer surface of the sintered cetamic body in order to improve safety for the magnetic field and to assure heat-radiating passage by way of precausion against a case where superconductivity break accidentially. To the contrary, when inherent properties of sintered ceramic body, such as the resistence to chemicals and the resistance to abrasion are requested, it is preferable to remove the metal pipe off the sintered body (FIG. 1J). The outer metal can be removed off the sintered body mechanically for example by means of grinding work or chemically for example etching liquid such as nitric acid.

In a variation of the process according to the present invention, almost all metal of the metal pipe may be removed during the sintering step, namely both of sintering and removal of the metal are carried out simultaneously, with leaving a very thin skin layer on the surface of the sintered body. The thickness of the thin skin layer left on the surface of the sintered body is less than 500 $\mu$m, preferably less than 200 $\mu$m, so that the thin skin layer left on the surface is held on the surface even if the metal fuse during the sintering operation owing to its surface tension withiout dropping of the fused metal.

It is also possible to carry out both of the plastic deformation for reducing the cross sectional dimention of the metal pipe and the heat-treatment simultaneously in order to complete two operations of sintering of the material powder and deformation of the metal pipe by means of hot-working. In this case, the reduction ratio in cross sectional direction of the metal pipe is preferably from 40% to 95%.

The hot-working means working, treatment or a metal processing which is carried out at a temperature which is higher than recrystallization temperature of a metal of the metal pipe. Thus, the metal pipe exhibits higher malleability above the recrystaline temperature because metal lost considerably its resistance against deformation. Still more, work hardening will not left even if recrystallization of the metal take place after it is quenched. Of course, this hot-working is performed below the melting point of metal, but preferably, it is performed at a temperature which is 10° C. lower than the melting point.

It is preferable that the plastic deformation is performed by such a metal working or processing that comprssive stress is effected onto an article to be worked such as wire-drawing and forging operations, so as to make the material powder filled in the metal pipe be compacted.

It is also possible to adopt such sequence of steps comprising, after the plastic deformation such as wire-drawing for reducing the cross sectional dimention of the metal pipe complete, subjecting the deformed pipe to an intermediate annealing at a temperature where the metal pipe is annealed, further carrying out plastic deformation such as wire-drawing of the annealed pipe, and then subjecting the resulting pipe to the final heat-treatment to sinter the material ceramic powder filled in the metal pipe. In this case, the metal pipe may be removed off after the intermediate annealing and the first annealing but before the final sintering of the material ceramic powder in order to prevent undesirable reaction between the ceramic powder and the metal of the metal pipe at a high sintering temperaure. It is also possible to repeat another intermediate annealing after the first wire-drawing following the first intermediate annealing, so that, after then, the metal pipe is removed off after the repeated second intermediate annealing before the final sintering. According to this sequence of operations comprising the first annealing, wire-drawing and the second annealing, the second annealing give advantageously enough strength which can resiste against external force excerted to the annealed article and/or a desired configuration to the annealed body, before it is passed to and during it is maintained in the final sintering furnace in which the annealed article is sintered with no outer metal pipe. The combination of the wire-drawing and the intermediate annealing can be repeated for desired times to increase the dimentional reduction ratio in the cross sectional direction with no breakage of a wire, and hence the resulting wire shows a fine diameter and higher strength.

The intermediate annealing may be performed in one of two temperature ranges of (1) the first temperature range where the metal pipe is annealed but ceramic powder is not sintered and (2) the second temperature range where the metal pipe is annealed and the ceramic powder is also sintered.

If the intermediate annealing following the wire-drawing is performed in the first temperature range (1) where the metal pipe is annealed but ceramic powder is not sintered, higher dimentional reduction ratio can be achieved to obtain a fine ceramic wire having satisfactory deflection strength with no breakage. In this case, the intermediate annealing can be performed at a suitable temperature which is selected in function of the kind of metal of the metal pipe and componets and composition of the ceramic powder.

In case of a combination of a metal pipe having relatively higher anneling temperaure and a material ceramic powder having relatively lower sintering temperature, it is preferable to adopt the second temperature range (2) where the metal pipe is annealed and the ceramic powder is also sintered.

It is also possible to add a cold working step before and/or after the hot working step. Still more, it is also possible to repeat the series of steps including the abovementioned hot working and sintering step for several times.

According to a special variation of the process of the present invention, through holes which pass through a wall of the metal pipe are made after the plastic deformation complete, so that the material ceramic powder filled in the perforated metal pipe is sintered in an open condition.

In this variation, after the wire drawing, the wall of the metal pipe of the wire is perforated by means of laser, electron beam or a microdrill or the like, so as to permit passage of gas, particularly oxygen containing gas through the perforations or holes. If the metal pipe is not perforated, the material ceramic powder is sintered under a closed or sealed condition in the outer metal pipe in the sintering stage, so that oxygen deficient of the compound oxide exceed too much to obtain a product having superior superconductivity. Therefore, it is preferable to make through holes in the wall and to carry out the sintering of the metal pipe in an atmosphere containing oxygen gas to supply a proper amount of oxygen to the compound oxide in the metal pipe. It is the general property of superconducting compound oxides that the superconductivity is influenced by the oxygen deficinecy in the crystal structure. In other words, the oxygen deficiency as well as the crystal structure of the resulting sintered wire are keys of the superconductivity. Therefore, it is important to adjust atom ratios of elements so as to satisfy the abovementioned ranges of elements defined in connection with the general formula: $(\alpha_{1-x}, \beta_x)_y\gamma_yO_z$ as well as to fulfill the abovementioned procedure according to the present invention in order to adjust the oxygen contents defined by the general formula. Otherwise, the value of Tc can not be improved owing to different crystal structure and improper oxygen deficiency.

According to the abovementioned special variant, satisfactory oxygen can be supplied through the through holes or a slit made in the outer metal layer, so that the resulting sintered body of compound oxide possess a crystal structure of so to say quasiperovskite type crystal structure such as orthorhombic structure or the like which can produce Cooper pairs at higher possibility.

The through holes or slit is preferably closed by filling them with sealing mateial or by covering the whole outer surface of the metal pipe with another metal seath or covering in order to protect the compound oxide from deterioration due to attack by surrounding humid gas.

It is also preferable to increase the partial pressure of oxygen gas during the sintering stage in order to promote penetration of oxygen gas through the holes or slits.

Now, the process according to the present invention will be described with reference to illustrative Examples, but the scope of the present invention should not be limited thereto.

EXAMPLE 1

As a material powder to be sintered, a powder mixture of 85% by weight of $La_2O_3$, 4% by weight of $BaCO_3$ and 11% by weight of CuO was used. The powder mixture was compacked and then sintered at the conditions of 900° C., for 24 hours. The resulting sintered body itself exhibited superconductivity.

The sintered body was then pulverized into powder and was compacted in a copper pipe having an inner diameter of 5 mm and a wall thickness of 0.3 mm. The metal pipe filled with the sintered powder was then heat-treated at 850° C. for 10 hours to sinter the powder. After the sintering completed, the copper pipe thus treated was caulked without cooling it.

The resulting superconducting wire showed Tc of 30 K and was able to bend up to a curvature of 300 mm.

EXAMPLE 2

As a material powder to be sintered, a powder mixture of 85% by weight of $La_2O_3$, 2% by weight of SrO and 13% by weight of CuO was compacted in a copper pipe having an inner diameter of 10 mm and a wall thickness of 1 mm. The metal pipe filled with the powder mixture was heat-treated at 850° C. for 24 hours. And then, before the pipe lost heat, the copper pipe thus treated was wire-drawn to such extent that the the diameter of the copper pipe became to 2 mm under a hot condition.

The resulting superconducting wire showed Tc of 35 K and was able to bend up to a curvature of 100 mm.

EXAMPLE 3

85.5% by weight of commercially available $La_2O_3$ powder, 3.1% by weight of commercially available $SrCO_3$ and 11.4% by weight of commercially available CuO were mixed in an attoriter in wet and then dried. The dried powder was compacted in a press under a pressure of 100 kg/cm$^2$ and then sintered at 900° C. in air for 20 hours. The sintered body was pulverized and passed through a sieve to obtain powder of 100 mesh under.

After treatment of granulation, the material powder was compacked in a copper pipe having an outer diameter of 5 mm, an inner diameter of 4 mm and a length of 1 m and opposite ends of the pipe were seale. The pipe filled with the material powder was subjected to wire-drawing to reduce its outer diameter down to 1.8 mm and then sintered at 1,050° C., for 2 hours in vacuum. The resulting sintered ceramic wire was covered with a copper sheath having a wall thickness of 0.2 mm and had a length of 7.7 m.

The measured value of the critical temperature (Tc) where this sintered ceramic wire exhibited superconductivity was 35.5 K. The ceramic wire showed the deflective strength of 24.7 kg/cm$^2$ and the rupture toughness (KIC)of 2.2 MN/m$^{3/2}$.

EXAMPLE 4

The same material powder as Example 3 was compacted in five pipes of iron having an outer diameter of 6 mm, an inner diameter of 5 mm and a length of 50 cm and opposite ends of each pipe were sealed. The pipes filled with the material powder were subjected to wire-drawing so as to reduce their outer diameter at the dimentional reducction ratios of 95%, 88%, 56%, 37% and 14% respectively and then were heat-treated at 1,100° C. for 2 hours in vacuum to sinter the material powder.

After then, the outer irron pipe or seath was removed by washing it with acid. The result showed such a fact that a sintered ceramic wire which was wire-drawn at the dimentional reduction ratio of 95% brake into nine pieces and a sintered ceramic wire which was wire-drawn at the dimentional reduction ratio of 14% was not sintered sompletely and hence could not keep its shape, while the other three sintered ceramic wires were sintered completely with no breakage.

EXAMPLE 5

The same material powder as Example 3 was compacted in five pipes of nickel having an outer diameter of 6 mm, an inner diameter of 5 mm and a length of 1 m and opposite ends of each pipe were sealed. The pipes filled with the material powder were subjected to wire-drawing to reduce the outer diameter down to 2.0 mm and then was heat-treated at 1,150° C. for 2 hours to sinter the material powder.

After then, the outer nickel pipe or sheath was removed mechanically by cutting operation to obtain a sintered ceramic wire having a diameter of 1.6 mm and a length of 9 m.

The measured value of the critical temperature (Tc) where this sintered ceramic wire exhibited superconductivity was 37.0 K. The ceramic wire showed the deflective strength of 24.4 kg/cm$^2$ and the rupture toughness (KIC)of 2.1 MN/m$^{3/2}$.

EXAMPLE 6

The same material powder as Example 3 was compacted in five pipes of silver having an outer diameter of 6 mm, an inner diameter of 5 mm and a length of 1 m and opposite ends of each pipe were sealed. The pipes filled with the material powder were subjected to wire-drawing to reduce the outer diameter down to 2.0 mm and then was heat-treated at 950° C. for 2 hours to sinter the material powder.

After then, the outer silver pipe or sheath was removed mechanically by cutting operation to obtain a sintered ceramic wire having a diameter of 1.5 mm and a length of 6.3 m.

The measured value of the critical temperature (Tc) where this sintered ceramic wire exhibited superconductivity was 37.0 K.

EXAMPLE 7

85.5% by weight of commercially available $La_2O_3$ powder, 3.1% by weight of commercially available $SrCO_3$ and 11.4% by weight of commercially available CuO were mixed in an attoriter in wet and then dried. The dried powder was compacted in a press under a pressure of 100 kg/cm$^2$ and then sintered at 900° C. in air for 20 hours. The sintered body was pulverized and passed through a sieve to obtain powder of 100 mesh under.

After treatment of granulation, the material powder was compacted in an iron pipe having an outer diameter of 5 mm, an inner diameter of 4 mm and a length of 1 m and opposite ends of the pipe were sealed. The pipe filled with the material powder was subjected to wire-drawing to reduce its outer diameter down to 1.8 mm and then sintered at 1,050° C., for 2 hours in vacuum. The resulting sintered ceramic wire was covered with an iron sheath having a wall thickness of 0.2 mm and had a length of 7.7 m.

The measured value of the critical temperature (Tc) where this sintered ceramic wire exhibited superconductivity was 35.1 K. The ceramic wire showed the deflective strength of 25.1 kg/cm$^2$ and the rupture toughness (KIC)of 2.1 MN/m$^{3/2}$.

EXAMPLE 8

The same material powder as Example 7 was compacted in seven pipes of iron having an outer diameter of 6 mm, an inner diameter of 5 mm and a length of 50 cm and opposite ends of each pipe were sealed. The pipes filled with the material powder were subjected to wire-drawing so as to reduce their outer diameter at the dimensional reduction ratios of 95%, 90%, 83%, 56%, 37%, 20% and 14% respectively and then were heat-treated at 1,100° C. for 2 hours in vacuum to sinter the material powder.

After then, the outer iron pipe or sheath was removed by washing it with acid. The result showed such a fact that a sintered ceramic wire which was wire-drawn at the dimensional reduction ratio of 95% broke into ten pieces while a sintered ceramic wire which was wire-drawn at the dimensional reduction ratio of 14% was not sintered completely and hence could not keep its shape, while the other three sintered ceramic wires were sintered completely with no breakage.

EXAMPLE 9

The same material powder as Example 7 was compacted in five pipes of nickel having an outer diameter of 6 mm, an inner diameter of 5 mm and a length of 1 m and opposite ends of each pipe were sealed. The pipes filled with the material powder were subjected to wire-drawing to reduce the outer diameter down to 2.0 mm and then was heat-treated at 1,150° C. for 2 hours to sinter the material powder.

After then, the outer nickel pipe or sheath was removed mechanically by cutting operation to obtain a sintered ceramic wire having a diameter of 1.6 mm and a length of 9 m.

The measured value of the critical temperature (Tc) where this sintered ceramic wire exhibited superconductivity was 35.8 K. The ceramic wire showed the deflective strength of 24.9 kg/cm$^2$ and the rupture toughness (KIC) of 2.2 MN/m$^{3/2}$.

EXAMPLE 10 superconducting ceramic powder (an average particle size of 3 μm) having a composition of $Y_{0.8}Sr_{0.2}CuO_3$ was compacted in a pipe of platinum. Then, the resulting platinum pipe was inserted into an outer pipe of oxygen-free copper. The composite pipe comprising the platinum pipe filled with the ceramic powder and covered by the outer oxygen-free copper pipe was subjected to metal workings of extrusion and wire-drawing to reduce its outer diameter to 0.8 mm. The composite pipe showed an areal ratio of Cu:Pt:ceramic=10:1:2 in its cross section The composite pipe was heat=treated at 900° C. for 12 hours in air to sinter the material powder inside the metal pipes.

The resulting superconducting wire showed Tc of 100 K which was almost same level of superconductivity as a tablet which was produced by steps of press-molding and then sintering the same powder as the abovementioned Example 10 and which showed Tc of 105 K.

For comparison, the abovementioned composite pipe which was not subjected to the heat-treatment did not show any superconductivity even in liquid helium (4.2 K).

EXAMPLE 11

A powder mixture of 20.8% by weight of $Y_2O_3$, 54.7% by weight of $Ba_2CO_3$ and 24.5% by weight of CuO was compacted in a silver pipe having an outer diameter of 6 mm, an inner diameter of 5 mm and a length of 1 m. after the opposite end of the pipe were sealed, the pipe was subjected to wire-drawing to reduce its outer diameter to 2.0 mm and after then was heated at 950° C. for 2 hours to sinter the powder mixture. After then, the outer silver pipe or sheath was removed mechanically by cutting work to obtain a sintered ceramic wire having a diameter of 1.5 mm and a length of 6.3 m.

The measured value of the critical temperature (Tc) where this sintered ceramic wire exhibited superconductivity was 87.0 K.

EXAMPLE 12

A ceramic powder which had been preliminarily sintered was finally sintered at a 920° C. for 20 hours to produce a powder having an average particle size of 0.1 μm and having a composition of $YBa_2Cu_3O_7$. The resulting sintered body was pulverized again to produce a material powder of 0.1 mm which was then filled in a stainless steel pipe having an inner diameter of 5 mm and an outer diameter of 9 mm. The pipes filled with the material powder were subjected to wire-drawing to reduce the outer diameter to 2 mm.

The critical temperature (Tc) of this sintered ceramic wire was 97 K and the critical current density was 103 A/cm$^2$.

For comparison, the same ceramic powder which had been preliminarily sintered as Example 12 was molded into a tablet and the this tablet was heat-treated at the same condition as Example 12. After the tablet was pulverized, the resulting powder was compacted in a stainless steel pipe and then subjected to wire-drawing under the same condition as Example 12. The superconducting wire obtained showed the critical temperature (Tc) of 92 K and the critical current density was 12 A/cm$^2$.

This fact revealed that the superconducting wire manufacture according to Example 12 possess higher critical current density.

EXAMPLE 13

20.8% by weight of commercially available $Y_2O_3$ powder, 54.7% by weight of commercially available $BaCO_3$ and 24.5% by weight of commercially available CuO were mixed in an attoriter in wet and then dried. The dried powder was sintered at 880° C. in air for 24 hours. The sintered body was pulverized and passed through a sieve to obtain powder of 100 mesh under. The steps including sintering, pulverization and screening were repeated for three times.

After treatment of granulation, the material powder was compacted in an iron pipe having an outer diameter of 5 mm, an inner diameter of 4 mm and a length of 1 m and opposite ends of the pipe were sealed.

When the pipe filled with the material powder was subjected to a series of works of wire-drawing in such manner that its outer diameter was reduced at the cross sectional reduction ratio of 19% per one pass, the pipe broke when the outer diameter thereof was reduced to 1.2 mm.

Therefore, the wire-drawing was ceased when the outer diameter reduced to a value of 1.5 mm. And then, the pipe was subjected to a series of operation comprising an intermediate annealing at 750° C. for 25 hours, a plurality of wire-drawings each of which was carried out at the cross sectional reduction ratio of 18% per pass so that the pipe was reduced to o.6 mm in diameter, and a sintering at 930° C. for 3 hours.

The measured value of the critical temperature (Tc) was 38 K.

EXAMPLE 14

20.8% by weight of commercially available $Y_2O_3$ powder, 54.7% by weight of commercially available $BaCO_3$ and 24.5% by weight of commercially available CuO were mixed in an attoriter in wet and then dried. The dried powder was sintered at 950° C. in air for 3 hours. The sintered body was pulverized and passed through a sieve to obtain powder of 100 mesh under. The steps including sintering, pulverization and screening were repeated for three times.

The resulting material powder was compacted in a set of stainless steel pipes each having an outer diameter of 5 mm, an inner diameter of 4 mm and a length of 1 m and opposite ends of the pipe were sealed.

After the pipes were subjected to wire-drawing to reduce their outer diameter to 3.6 mm, they were sintered in air under the following different conditions:

(1) at 950° C. for 3 hours (2) at 850° C. for 3 hours (3) at 700° C. for 3 hours (4) at 500° C. for 3 hours (5) at 850° C. for 30 hours (6) at 700° C. for 30 hours (7) at 500° C. for 30 hours The resulting sintered ceramic wires had a length of 1.6 m and an outer metal layer of 0.4 mm thick.

Electrical resistance was measured to evaluate the properties as superconductor. Following is the result of the measurement.

(In the description hereinafter, Tc means the critical temperature of superconductivity and Tcf means a temperature at which electrical resistance become utterly zero)

In case of the condition (1), no superconductivity was observed. Color of a sliced cross section was red due to reduction of copper oxide CuO in the ceramic powder.

In case of the condition (2), Tc observed was 58 K and Tcf observed was 7 K. Observation of a sliced cross section revealed that CuO was not apparently reduced but changed to rather porous mass in comparison with the original sintered body from which the materiel powder was prepared.

In case of the condition of (3), no superconductivity was observed. Observation of a sliced section revealed that the ceramic material was not sintered completely but remained in a condition of granules.

In case of the condition of (4), no superconductivity was observed. Observation of a sliced cross section revealed that the material powder was hardly changed but remained in a powdered condition.

In case of the condition of (5), It was measured that Tc was 84 K and Tcf was 75 K. Observation of a sliced cross section revealed that the sintered ceramic body possessed almost same color and appearance as the original ceramic body from which the material powder was prepared.

In case of the condition of (6), Tc was 68 K and Tcf Was 47 K. A sliced cress section was observed to be similar to that of the condition (5) but a little porous.

In case of the condition of (7), no superconductivity was observed. A sliced section revealed that the ceramic powder remained in granular.

EXAMPLE 15

Powders of $BaCO_3$, $Y_2O_3$ and CuO each having a purity of more than 99.9% were prepared. They were weighed in such manner that the proportions of $BaCO_3:Y_2O_3:CuO$ became 20.8:54.7:24.5 by weight and mixed uniformly in an attritor in wet. After the mixture was dried at 110° C. for 1 hour, it was compacted under a pressure of 100 kg/cm$^2$. The resulting compact was sintered at 940° C. for 15 hours and then pulverized to obtain powder of 100 mesh under. Then, the abovementioned steps of compacting, sintering and pulverization were repeated for three times. Obtained powder was used in following wire-drawing stage described in Table 1. In this Example 15, a pipe of silver was used A variety of operational conditions and combinations of procedures adopted are summarized in Table 1.

The density (%) of the resulting sintered mass was determined by dividing the weight of a sample by a volume obtained by the specific gravity measurement method in which pores displaced with solution is calculated and it result was verified by dott-counting by means of a microscope. The current density (A/cm$^2$) thereof were determined by dividing the value of current just before a resistance appeared by a cross sectional area of a current passage. The result are also summarized in Table 1.

EXAMPLE 16

The same material powder as Example 15 was used and the same procedure as Example 15 was repeated except that the material powder was compacted in metal pipes of Al, Cu and Ni respectively.

The density (%) of the resulting sintered mass and the current density (A/cm$^2$) thereof were determined by the same method as abovementioned. The result are summarized in Table 2.

TABLE 1

| Sample No. | Material of Pipe | Manufacturing Process (Operational condition) | Density (%) | Critical Current Density (A/cm$^2$) |
|---|---|---|---|---|
| Ag-1 | Ag | Wire-drawing by dies from 20 mmφ to 6 mmφ in air and then Sintering | 62 | 150 |
| Ag-2 | Ag | Swaging in air from 20 mmφ to 6 mmφ and then Sintering. | 68 | 210 |
| Ag-3 | Ag | Swaging at 900° C. from 20 mmφ to 6 mmφ and then Sintering. | 87 | 570 |
| Ag-4 | Ag | Swaging at 900° C. from 20 mmφ to 10 mmφ and then Sintering. After then, secondary Swaging at 900° C. from 10 mmφ to 6 mmφ and then Sintering. | 95 | 870 |
| Ag-5 | Ag | Swaging at 900° C. from 20 mmφ to 10 mmφ and then Sintering. After then, secondary Swaging in air from 10 mmφ to 6 mmφ and then Sintering. | 93 | 800 |

TABLE 1-continued

| Sample No. | Material of Pipe | Manufacturing Process (Operational condition) | Density (%) | Critical Current Density (A/cm$^2$) |
|---|---|---|---|---|
| Ag-6 | Ag | Swaging at 900° C. from 20 mmφ to 6 mmφ and then Sintering. | 81 | 450 |
| Ag-7 | Ag | Swaging at 950° C. from 20 mmφ to 6 mmφ and then Sintering. | note | |

Note: In this sample, the pipe ruptured due to poor strength of Ag, and could not measured.

TABLE 2

| Sample No. | Material of Pipe | Manufacturing Process | Density (%) | Critical Current Density (A/cm$^2$) |
|---|---|---|---|---|
| Al-1 | Al | Swaging at 600° C. from 20 mmφ to 2 mmφ and then Sintering (600° C. 20 h) | 75 | 280 |
| Ag-2 | Ag | Swaging in air from 20 mmφ to 2 mmφ and then Sintering (600° C. 20 h) | 58 | 75 |
| Cu-1 | Cu | Swaging at 600° C. from 20 mmφ to 2 mmφ and then Sintering (800° C. 15 h) | 80 | 350 |
| Cu-2 | Cu | Swaging in air from 20 mmφ to 2 mmφ and then Sintering (800° C. 15 h) | 61 | 100 |
| Ni-1 | Ni | Swaging at 800° C. from 20 mmφ to 2 mmφ and then Sintering (900° C. 15 h) | 89 | 370 |
| Ni-2 | Ni | Swaging in air from 20 mmφ to 2 mmφ and then Sintering (900° C. 15 h) | 63 | 110 |

EXAMPLE 17

Powders of $BaCO_3$, $Y_2O_3$ and CuO each having a purity of more than 99.9% and an average particle size of 1 um were prepared. They were mixed with such a proportion that Ba Y and Cu are satisfied a composition of $$Ba_{0.67}Y_{0.33}Cu_1O_{3-\delta}$$

in other words, the atom ratios of Ba:Y:Cu became 2:1:3 (the proportions of $BaCO_3:Y_2O_3:CuO=52.9:15.13:31.98$ by weight) and then were kneaded in wet for 3 hours in a mortal. The resulting powder mixture was dried at 200° C. for 7 hours in vacuum to remove water.

The dried powder was sintered in air at 930° C. for 24 hours and then the resulting cake-like mass was pulverized in a mortal and further milled in a ball-mill to reduce it to an average particle size of less than 30 μm.

The powder obtained was compacted in a pipe of stainless steel (SUS 310S) and opposite ends of the pipe were sealed. The pipe filled with the powder therein was subjected to repetitive operations of wire-drawing each of which was performed at a dimensional reduction ratio of 25% so that an outer diameter of the pipe was finally reduced to 1.8 mm.

Innumerable through holes each having a diameter of 200 μm were perforated in the pipe at a pitch of 20 mm by means of $CO_2$ laser.

Then, the perforated pipe was heat-treated at 1,000° C. for 16 hours to sinter the powder and then cooled slowly at a rate of 10° C./min. The sintering temperatures were selected in a rage where no fusion of the metal pipe occurred. Then, the pipe was heat-treated at 700° C. for 10 hours and then cooled slowly at a rate of 10° C./min.

The same procedure as abovementioned was repeated for a variety of compositions of material powder and pipes of different metals which are listed in Table 3 in which α, β, x and y mean elements and atom ratios in following formula:

$$(\alpha_{1-x}, \beta_x)_2Cu_yO_4$$

The result is summarized in the Table 3 in which Tci stands for the temperature at which resistance started to drop and Jc was the value of critical current density measured at 77 K. The result is summarized in Table 3.

TABLE 3

| Sample No. | α | β | x | y | Material of pipe | Sintering temp. (° C.) | Tci (° K.) | $J_c$ (A/cm$^2$) |
|---|---|---|---|---|---|---|---|---|
| 1 | Ba | Y | 0.33 | 1.0 | Stainless* | 1,000 | 94 | 1,000 |
| 2 | Ba | Y | 0.33 | 1.0 | Al | 900 | 90 | 800 |
| 3 | Ba | Y | 0.33 | 1.0 | Cu | 1,000 | 95 | 1,100 |
| 4 | Ba | Y | 0.33 | 1.0 | Fe | 1,040 | 91 | 900 |
| 5 | Ba | Y | 0.33 | 1.0 | Ni | 1,040 | 92 | 850 |
| 6 | Ba | Y | 0.33 | 1.0 | Ta | 1,030 | 94 | 1,050 |
| 7 | Ba | Y | 0.33 | 1.0 | Ag | 900 | 91 | 900 |
| 8 | Ba | Y | 0.4 | 1.1 | Stainless* | 1,000 | 88 | 700 |
| 9 | Ba | Y | 0.5 | 1.21 | Stainless* | 1,000 | 85 | 600 |
| 10 | Ba | Ho | 0.33 | 1.0 | Stainless* | 1,000 | 91 | 800 |
| 11 | Ba | Dy | 0.33 | 1.0 | Stainless* | 1,000 | 92 | 1,000 |
| 12 | Sr | La | 0.75 | 0.5 | Stainless* | 1,000 | 41 | 600 |
| 13 | Ba | La | 0.75 | 0.4 | Stainless* | 1,000 | 43 | 700 |
| 14 | Ba | Y | 0.33 | 0.4 | Stainless* | 1,000 | 88 | 900 |
| 15 | Ba | Y | 0.33 | 0.6 | Stainless* | 1,000 | 85 | 800 |

*The Stainless means SUS310S.

EXAMPLE 18

36.42% by weight of commercially available $Bi_2O_3$ powder, 23.07% by weight of commercially available SrCO₃, 23.07% by weight of commercially available CaCO₃ and 24.87 % by weight of commercially available CuO were mixed in an attoriter in wet and then dried. The dried powder was compacted under a pressure of 1,000 kg/cm² and then sintered at 800° C. in air for 8 hours. The sintered body was pulverized and passed through a sieve to obtain powder of 100 mesh under.

After treatment of granulation, the material powder was compacted in a silver pipe having an outer diameter of 5 mm, an inner diameter of 4 mm and a length of 1 m and opposite ends of the pipe were sealed.

When the pipe filled with the material powder was subjected to wire-drawing to reduce its outer diameter to 1.8 mm. And then, the pipe was sintered at 800° C. for 2 hours to obtain a sintered ceramic wire having a length of 5.0 m and having an outer coating of silver layer of 0.3 mm thick.

The measured value of the critical temperature (Tc) of this sintered ceramic wire was 100 K.

What we claim are:

1. A process for manufacturing a superconducting elongated article including the steps of:

filling a metal pipe with material powder of a superconducting compound oxide;

subjecting the metal pipe filled with the material powder first to cold-plastic deformation and then to hot-plastic deformation to reduce the cross section of the metal pipe;

sintering the material powder filled in the metal pipe; and then controlling the cooling of the resulting metal pipe containing sintered ceramic material powder to a rate of less than 50° C./min.

2. A process as claimed in claim 1, wherein said metal pipe is made of a metal selected from the group consisting of Ag, Au, Pt, Pd, Rh, Ir, Ru, Os, Cu, Al, Fe, Ni, Cr, Ti, Mo, W and Ta and alloys including these metals as the base.

3. A process as claimed in claim 1, wherein said hot-plastic deformation is carried out at a temperature ranging form 700 to 1,000° C.

4. A process as claimed in claim 1, wherein the cross section of the metal pipe is reduced at a dimensional reduction ratio ranging from 16% to 92%.

5. A process as claimed in claim 4, wherein said hot-plastic deformation is performed by wire-drawing.

6. A process as claimed in claim 5, wherein said wire-drawing is performed by at least one means selected from the group comprising dies, roller dies and an extruder.

7. A process as claimed in claim 4, wherein said plastic deformation is performed by forging.

8. A process as claimed in claim 7, wherein said forging is performed by means of a swaging unit or rolls.

9. A process as claimed in claim 1, wherein said material powder of superconducting compound oxide is granulated previously before said material powder is compacted in the metal pipe.

10. A process as claimed in claim 1, wherein the metal pipe filled with the material powder is subjected to a series of hot-plastic deformation operations.

11. A process for manufacturing s superconducting elongated article the steps of:

filling material powder of a superconducting compound oxide into a metal pipe made of at least one selected from the group consisting of Ag, Au, Pt, Pd, Rh, Ir, Ru, Os, Cu, Al, Fe, Ni, Cr, Ti, Mo, W and Ta or alloys including these metals as the base;

subjecting the metal pipe filled with the material powder to hot-plastic deformation reduce the cross section of the metal pipe to such extent that the cross section of the metal pipe is reduced at a dimensional reduction ratio ranging from 16% to 92% under a heated condition, so that the material powder filled in the metal pipe is sintered; and then cooling the resulting metal pipe containing sintered ceramic material powder therein slowly at a rate of less than 50° C./min.

12. A process as claimed in claim 11, wherein said hot-plastic deformation is performed by wire-drawing.

13. A process as claimed in claim 12, wherein said wire-drawing is performed by at least one means selected from the group consisting of dies, roller dies and an extruder.

14. A process as claimed in claim 11, wherein said plastic deformation is performed by forging.

15. A process as claimed in claim 14, wherein said forging is performed by means of a swaging unit or rolls.

16. A process as claimed in claim 11, wherein said material powder contains a superconducting compound oxide having the crystal structure of a $K_2NiF_4$-type oxide.

17. A process as claimed in claim 16, wherein said material powder is selected from the group comprising [La, Ba]₂CuO₄ and [La, Sr]₂CuO₄.

18. A process as claimed in claim 11, wherein said material powder contains a superconducting compound oxide having a Perovskite-type crystal structure exhibiting superconductivity having the general formula:

$$(\alpha_{1-x}, \beta_x)\gamma_y O_z$$

in which α stands for an element selected form IIa group elements of the Periodic Table, β stands for an element selected from IIIa elements of the Periodic Table, γ stands for an element selected from a group comprising Ib, IIb, IIIb, IVa and VIIIa elements of the Periodic Table, and x, y and z are numbers which satisfy following respective ranges:

$$0.1 \leq x \leq 0.9,$$

$$0.4 \leq y \leq 4.0, \text{ and}$$

$$1 \leq z \leq 5.$$

19. A process as claimed in claim 18, wherein α is Ba, β is Y and γ is Cu.

20. A process as claimed in claim 18, wherein said material powder of superconducting compound oxide is granulated before said material powder is compacted in the metal pipe.

21. A process as claimed in claim 11, wherein the metal pipe is removed from a sintered body produced from the material powder, after the sintering is complete.

22. A process as claimed in claim 1, wherein the metal pipe filled with the material powder is subjected to cold-plastic deformation after the hot-plastic deformation.

23. A process according claim 1, wherein the rate of cooling is about 10° C./min.

* * * * *